United States Patent
Bogojevich et al.

(10) Patent No.: US 11,782,080 B2
(45) Date of Patent: Oct. 10, 2023

(54) REMOTELY CONTROLLED, AUTOMATED SHIELDING EFFECTIVENESS TEST SYSTEM FOR HIGH-ALTITUDE ELECTROMAGNETIC PULSE DETECTION

(71) Applicant: JaXon Engineering and Maintenance LLC, Colorado Springs, CO (US)

(72) Inventors: Robert N Bogojevich, Colorado Springs, CO (US); Chris T. Martin, Colorado Springs, CO (US); Kelly L. Rice, Colorado Springs, CO (US); David S. Robley, Colorado Springs, CO (US); Blake L. Smith, Colorado Springs, CO (US)

(73) Assignee: JaXon Engineering and Maintenance LLC, Colorado Springs, CO (US)

( * ) Notice: Subject to any disclaimer, the term of this patent is extended or adjusted under 35 U.S.C. 154(b) by 87 days.

(21) Appl. No.: 17/389,809

(22) Filed: Jul. 30, 2021

(65) Prior Publication Data

US 2023/0034312 A1 Feb. 2, 2023

(51) Int. Cl.
*G01R 27/28* (2006.01)
*G01R 29/08* (2006.01)

(52) U.S. Cl.
CPC .................. *G01R 29/0835* (2013.01)

(58) Field of Classification Search
CPC ............ G01R 29/0835; G01R 29/0878; G01R 29/105; H05K 9/0066; H05K 9/0067; H05K 9/0069; H05K 9/0071; H05K 9/0073; H05K 9/0009; H05K 9/0015; H04Q 1/116
See application file for complete search history.

(56) References Cited

U.S. PATENT DOCUMENTS

| 7,459,916 | B2  | 12/2008 | Crain et al. |
| 8,331,073 | B2  | 12/2012 | Chang |
| 9,040,933 | B2* | 5/2015  | Cobo et al. .......... H01Q 17/007 324/211 |
| 10,342,111 | B2 | 7/2019 | Nishikata et al. |
| 10,638,634 | B1* | 4/2020 | Elsasser et al. ...... H05K 9/0062 |

(Continued)

OTHER PUBLICATIONS

U.S.A., Department Of Defense, Military Standard 188-125-1 for High-Altitude Electromagnetic Pulse (HEMP) Protection for Ground-Based C4I Facilities Performing Critical, Time-Urgent Missions for Common Long-Haul/Tactical Communications Systems, Jun. 26, 1990.

*Primary Examiner* — Thang X Le
(74) *Attorney, Agent, or Firm* — Brenda L. Speer, LLC; Brenda L. Speer (57) ABSTRACT

The present invention is a remotely controlled, automated shielding effectiveness test system for hardening against the effects of high altitude electromagnetic pulses. The system monitors and reports the on-going effectiveness of an enclosure that shields electronic devices and communications systems from electromagnetic pulses. The system reports provide information to a user to determine whether corrective action is needed for the enclosure to ensure continued protection of the electronic devices and communications systems within the enclosure. The system comprises providing a high-altitude electromagnetic pulse (HEMP) enclosure enclosing at least an electronic device, and an electronic testing apparatus for testing effectiveness of HEMP shielding of the enclosure; and performing a shielding effectiveness test by the apparatus on the enclosure, comprising a first compression sub-test, a second environment sub-test, and a third final shielding effectiveness sub-test.

10 Claims, 6 Drawing Sheets

(56) References Cited

U.S. PATENT DOCUMENTS

| | | | |
|---|---|---|---|
| 11,122,718 B2* | 9/2021 | Embleton et al. | ... H05K 7/1492 |
| 2010/0208433 A1* | 8/2010 | Heimann et al. | ...... H04Q 1/112 |
| | | | 29/407.01 |
| 2011/0088940 A1* | 4/2011 | Nordling et al. | .... H05K 9/0001 |
| | | | 174/382 |
| 2014/0008119 A1* | 1/2014 | Brandt | ................ H05K 9/0007 |
| | | | 174/382 |
| 2019/0230828 A1 | 7/2019 | Murch et al. | |

* cited by examiner

REMOTELY CONTROLLED, AUTOMATED SHIELDING EFFECTIVENESS TEST SYSTEM FOR HIGH-ALTITUDE ELECTROMAGNETIC PULSE DETECTION

BACKGROUND OF THE INVENTION

Field of the Invention

The field of the invention is a remotely controlled, automated shielding effectiveness test system, in particular for hardening against the effects of high-altitude electromagnetic pulses.

Description of Related Art Including Information Disclosed Under 37 CFR 1.97 and 37 CFR 1.98

High altitude electromagnet pulse (HEMP) hardening and electromagnetic pulse (EMP) hardening are used to prevent damage to electronic devices and communications systems from solar flares, naturally occurring atmospheric electromagnetic anomalies, and intentionally created and inflicted pulses that can disrupt transmission signals. Electronic devices and communications systems are shielded from HEMP and EMP within an enclosure that can prevent, deflect, and diminish penetration by such pulses. It is important to monitor the on-going effectiveness of such an enclosure with regard to pulse penetration and deterioration, so that corrective action can be taken as needed to protect the electronic devices and communications systems within such enclosure. The enclosure may be constructed of metal and may be constructed of any suitable material. The enclosure may be of any size, from a box that may enclose a single electronic device, to a building that may enclose from a single electronic device to numerous electronic devices.

U.S. Pat. 7,459,916 issued Dec. 2, 2008, by Crain et al. for Electromagnetic Shielding Defect Monitoring System and Method for Using the Same discloses an electromagnetic shielding defect monitoring system that includes a transmit system adapted to transmit a first electromagnetic field toward a first surface of an electromagnetically shielded enclosure, thereby generating a first current on the first surface, a stationary receive system adapted to detect a second electromagnetic field transmitted from a second surface of the electromagnetically shielded enclosure by a second current induced on the second surface by the first current and to generate a corresponding detected signal; control circuitry adapted to control operations of the transmit and receive systems; and analysis circuitry adapted to identify a location of a defect in the electromagnetically shielded enclosure based upon operations of the transmit and receive systems and based upon the detected signal.

U.S. Pat. 8,331,073 issued Dec. 11, 2012, by Chang for Electromagnetic Pulse Protection Circuit Having Wave Filtering Capability discloses an electromagnetic pulse protection circuit having wave filtering functions, composed of an inductor free slow response protection circuit and a fast response protection circuit, and a filter is series-connected on a signal transmission route, and is utilized to provide impedance in effectively preventing electromagnetic pulses caused by lightning (LS) or other electronic weapon (NEMP, HEMP, PEMP) interferences. In addition, it is capable of suppressing electromagnetic pulses at specific frequencies, thus, raising the capability of electronic elements in resisting against electromagnetic pulses. Furthermore, said filter is made of high-temperature-super-conduction (HTSC) material, so that when said HTSC material of said filter is subject to a sudden infusion or invasion of said electromagnetic pulses, it is switched to a high impedance state in a very short period of time in effectively restricting currents passing through said filter, hereby avoiding the damages of a communication system.

U.S. Pat. 9,040,933 issued May 26, 2015, by Cobo et al. for controlling Electromagnetic Radiation in a Data Center discloses controlling electromagnetic ('EM') radiation in a data center having a number EM sections, including: receiving, by an EM controller, a specification of preferred EM radiation charac-teristics for the data center; and setting, by the EM controller, a state of each EM section in accordance with the specification, where the state of each EM section may be one of: an absorption state in which the EM section absorbs EM radia-tion or a reflection state in which the EM section reflects EM radiation.

U.S. Pat. 10,342,111 issued Jul. 2, 2019, by Nishikata et al. for Electromagnetic Pulse Protection Method and Electromagnetic Pulse Protection system discloses an electromagnetic pulse protecting method includes: searching a threat that generates an electromagnetic pulse; and generating plasma in a light-condensed point by condensing a laser beam on a light-condensed point in response to detection of the threat. Thus, various protection objects which contain a protection object having an electric opening indispensably can be protected from an attack by the electromagnetic pulse.

U.S. Pat. Publication 2019/0230828 published Jul. 25, 2019, by Murch et al. for Electromagnetic Pulse/High Altitude Electromagnetic Pulse (EMP/HEMP) Filter System discloses a filter design configured to operate in the medium voltage range of 1000 to 5000 volts, provides protection against Electromagnetic Pulse/High Altitude Electromagnetic Pulse (EMP/HEMP) intentional electromagnetic interference pulses. The filter utilizes no oil filled components to preclude the catastrophic failures (explosions) during operation. Many of the components incorporated in the present design are suited to absorbing harmonics without failing. In addition to mitigating E1 and E2 pulses, the filter is resistant to line harmonics which have proved to cause filter failure in past designs. The filter provides EMP/HEMP conducted pulse protection for downstream electronics inside hardened shelters for medium and high voltage applications.

Detection of and protection from EMP and HEMP pulses is conducted in person and onsite. HEMP enclosures are located at high altitude in places which are often remote and not easily accessible. Conducting testing in person and onsite at such locations can be difficult and problematic. There is a need for a remotely controlled, automated shielding effectiveness test system, in particular for hardening against the effects of high altitude electromagnetic pulses.

BRIEF SUMMARY OF THE INVENTION

A remotely controlled, automated shielding effectiveness test system comprising providing a high-altitude electromagnetic pulse enclosure enclosing at least an electronic device; providing an electronic testing apparatus for testing effectiveness of HEMP shielding of the enclosure; and performing a shielding effectiveness test by the apparatus on the enclosure; wherein the shielding effectiveness test comprises performing a first compression sub-test by the apparatus on the enclosure, then performing a second environment sub-test by the apparatus on the enclosure, and then performing a third final shielding effectiveness sub-test by the apparatus on the enclosure.

The compression sub-test comprises setting an attenuation level to zero; setting a network analyzer switch path to loopback and to terminate a receiver; performing a sweep of the enclosure; switching a network analyzer path to loopback, but returning a receiver to an environment; performing another sweep; comparing a terminated sweep to an environment sweep and accounting for attenuation; recording a current attenuation level for each data point wherein the sweeps match; reaching a decision point; and determining that all the sweep data points match. The compression sub-test further comprises determining that not all the sweep data points match; adding attenuation to the system; performing another sweep; comparing a terminated sweep to an environment sweep and accounting for attenuation; recording a current attenuation level for each data point wherein the sweeps match; reaching a decision point; and determining that all the sweep data points match.

The environment sub-test comprises recording during the compression test each unique attenuation level; adjusting attenuation for each unique level recorded in the recording step; sweeping the system N times; wherein N is determined by a user; reading a minimum of the N sweeps for each frequency point and recording the minimum as a 'best case' reading; saving the 'best case' reading for each frequency point of the reading step in which a current attenuation is applicable; repeating the environment test as necessary until; and achieving a satisfactory attenuation.

The final shielding effectiveness sub-test comprises recording during the compression sub-test each unique attenuation level; adjusting attenuation for each unique level recorded; sweeping the system N times; wherein N is determined by a user; reading a minimum of the N sweeps for each frequency point; recording the minimum of the N sweeps as a 'best case' reading; comparing a computed shielding effectiveness value of each frequency point with an acceptable minimum shielding effectiveness value; reaching a decision point; and determining the shielding effectiveness value is acceptable. The final shielding effectiveness sub-test further comprises determining the shielding effectiveness value is unacceptable; sweeping a small, dense set of points centered around an offending frequency point for each frequency point with an invalid shielding effectiveness value; using statistical analysis and removing outliers from a sweep data set of frequency points; selecting a lowest frequency point within a subset of micro-sweep frequency points; calculating the shielding effectiveness value using the lowest frequency point from the selecting step and comparing the lowest frequency point with an acceptable minimum shielding effectiveness value; reaching a decision point; and determining the shielding effectiveness value is acceptable. The final shielding effectiveness sub-test further comprises determining the shielding effectiveness value is unacceptable; counting a number of micro-sweeps performed; reaching a decision point; determining if there have been more than M sweeps; wherein M is determined by a user; and determining the shielding effectiveness value is acceptable.

LIST OF REFERENCE NUMERALS 2 enclosure
4 walls
6 door
8 interior antennae assemblies
10 TX unit
12 interior server rack
14 exterior antennae assemblies
16 RX unit
18 exterior server rack
20 full SE test
22 compression test
24 environment test
26 final SE test
28 begin compression test
30 set attenuation
32 switch network and terminate receiver
34 perform terminated sweep
36 switch network and return receiver
38 perform environment sweep
40 compare sweeps
42 record attenuation level
44 sweeps match
46 finish compression test
48 sweeps do not match
50 add attenuation
52 begin environment test
54 select unique attenuation
56 adjust attenuation
58 sweep N times
60 record best case reading
62 save best case reading
64 repeat
66 finish environment test
68 begin final SE test
70 select unique attenuation
72 adjust attenuation
74 sweep N times
76 record best case reading
78 save best case reading
80 compare SE values
82 acceptable SE
84 repeat
86 unacceptable SE
88 invalid SE
90 sweep offending frequency point
92 analyze and remove outliers
94 select lowest frequency point
96 compare SE values
98 unacceptable SE
100 fewer than M sweeps
102 count micro-sweeps
104 more than M sweeps
106 repeat
108 acceptable SE
110 finish final SE test

DETAILED DESCRIPTION OF THE INVENTION

The present invention is a high-altitude electromagnetic pulse ("HEMP") hardness evaluation system and is more particularly described as a remotely controlled, automated apparatus and method for evaluating high-altitude electromagnetic pulse intrusion per MIL-STD-188-125-1. The system is fully automated for testing the effectiveness of a HEMP enclosure and does not require a user to be onsite.

Electronic devices and communications systems that need to be protected from either electromagnetic pulses (EMP), or high-altitude electromagnetic pulses (HEMP), are housed within enclosures known as EMP or HEMP enclosures. A typical enclosure comprises four walls, a floor, and a roof constructed of metal, other metal composite material, or any other suitable material to shield or protect from penetration of EMPs or HEMPs. The enclosure is also commonly referred to as a HEMP box, or physical barrier structure.

The system of the present invention comprises an electronic testing apparatus, namely, an apparatus for testing the effectiveness of HEMP shielding of an enclosure. The electronic testing apparatus detects and identifies degradation of, defects in, unintended penetration of, and malicious tampering with the HEMP shielding ability of an enclosure.

The system of the present invention increases accuracy of the data collected, and detects tampering, anomalies, and deviations. The system uses statistical analysis and repeated measurements to compile data in a meaningful way. The system is a remote maintenance tool with hardware that feeds data into software. MIL-STD-188-125-½ and MIL-HDBK-423 set forth how to build the shield to survive a nuclear event. The method tests the enclosure, and the incoming electrical lines to the enclosure.

The system of the present invention provides remotely accessible shield effectiveness testing that meets the intent of United States military standard MIL-STD-188-125 SE. The system is rack mountable and capable of being installed in both mobile and fixed facilities. For instance, the system is adaptable into a transportable version for field testing. The system may also be custom configured. The system is scalable for structure size from a server rack to a building or enclosure.

Key features of the system of the present invention are that tests can be conducted remotely, the tests provide indication of shielding faults, and a troubleshooting mode, or test tools, to localize shielding defects. Shielding faults of the enclosure include degradation of harness critical items, such as door fingerstock, RF gaskets, etc.; degradation or failure of shield barrier or structure, such as rust or corrosion; monitoring of ambient environment for evidence of tampering; and detection of malicious penetrations of the enclosure. These faults can be recorded, and test data presented, to show the performance over time, and trend analysis, of the effectiveness of the enclosure.

Technical specifications of the system are as follows. Shielding Effectiveness ("SE") dynamic range is 120+ dB, transmit power is less than 1 W conducted, there is less than 2 W Effective Isotropic Radiated Power ("EIRP"), the system complies with FCC (Federal Communications Commission) emission limits, and no frequency authorization is needed. Frequency range is 100 MHz to 1 GHz, based on test article size and typical shielding faults, and frequency range is extendable to lower frequency bands. Frequency density and resolution covers 201 discrete test frequencies, and 30 Hz to 100 Hz resolution. Technically, the frequencies are evenly distributed in log space. Additionally, Intermediate Frequency ("IF") bandwidth "resolution" at each point is fixed, the spacing between points is log spaced. But functionally, the system of the present invention would do the same thing if the points are linearly space, log spaced, or selected in any other order from a list—the point spacing is a user preference and bears no consequence to the method of measurement making of the system of the present invention. The same applies with regard to the resolution bandwidth. Antenna configuration is scalable as determined by the size of the HEMP enclosure. Monitoring of the ambient spectral environment by the system includes detection of jamming and undesired signals.

Physical specifications of the system are as follows. System control of all interfaces to and from EM barrier via fiber optic cable, and control software is adapted to user specifications. Security and alarms can be set to user requirements and can include door alarm, shielding alerts, transmitter (wherein "TX" is an abbreviation for either "transmit" or "transmitter" per context), receiver (wherein "RX" is an abbreviation for either "receive" or "receiver" per context), and built in test failure alarms. AC/DC power is used and internal components can operate from DC supply voltages, and system components can include UPS (uninterruptible power supply) per user specifications. Cabinet-style packaging is available for 2 RU (wherein an "RU" is a Rack Unit of approximately 1.75" in height) interior unit, and a 3 server RU exterior unit. Environmental conditioning can be done per user specifications.

The software for the testing method of the system of the present invention insures no false data and no false returns. The software tests strength of signal, and measurement of the range tested. The antennae arrangement of the system depends on the size of the object and what is being tested.

Figure 1:
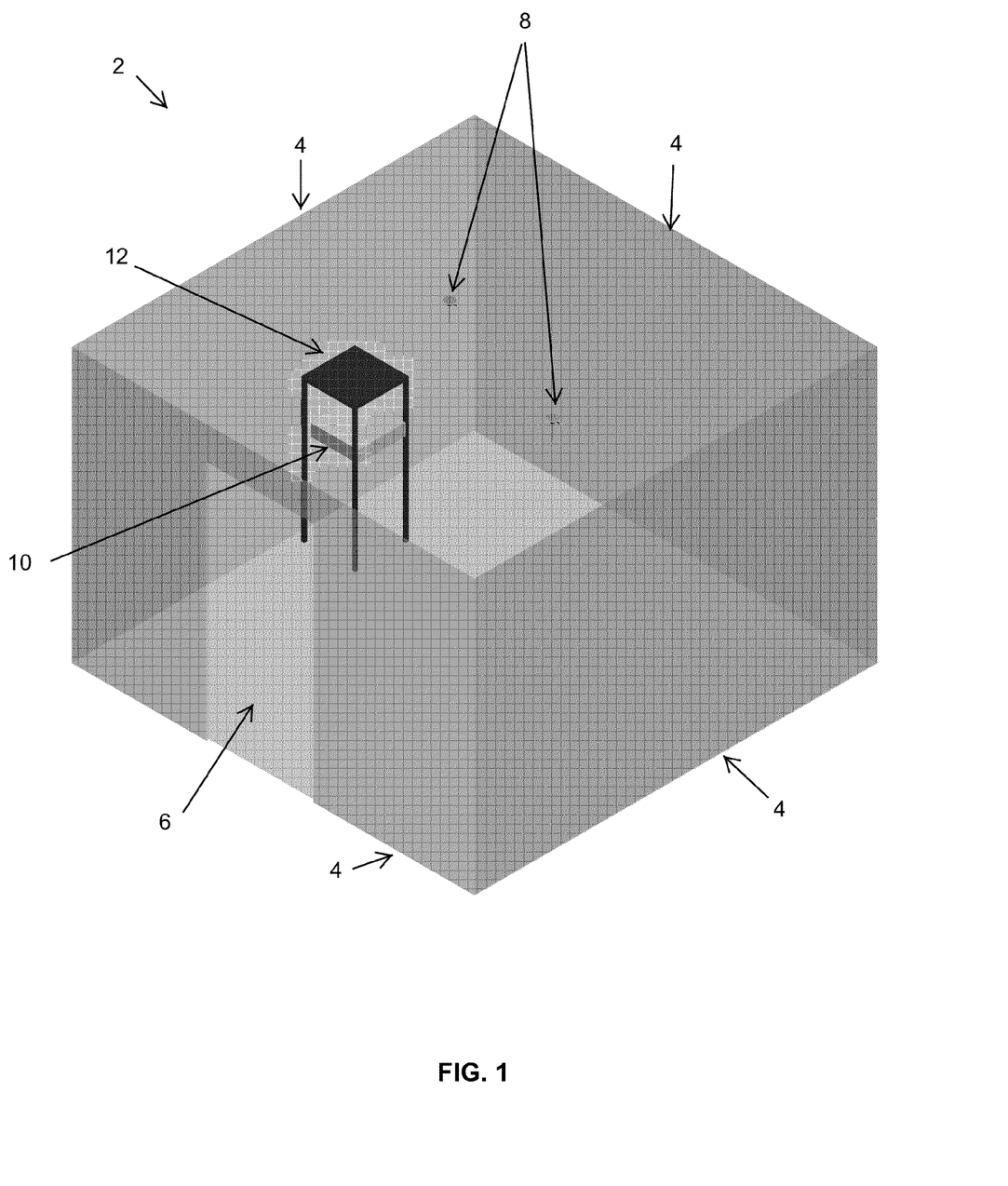
FIG. 1 is a perspective view of an interior of an example enclosure used with the system of the present invention.

With reference to FIG. 1, shown is a perspective view of an interior of an example enclosure used with the system of the present invention. The enclosure is a typical enclosure, and a suitable enclosure need not have all the features shown in FIG. 1. Further, the enclosure may be constructed of metal and may be constructed of any suitable material. The enclosure may be of any size, from a box that may enclose a single electronic device, to a building that may enclose from a single electronic device to numerous electronic devices. An enclosure 2 comprises four walls 4, a door 6, interior antennae assemblies 8, a TX unit 10, and an interior server rack 12.

Figure 2:
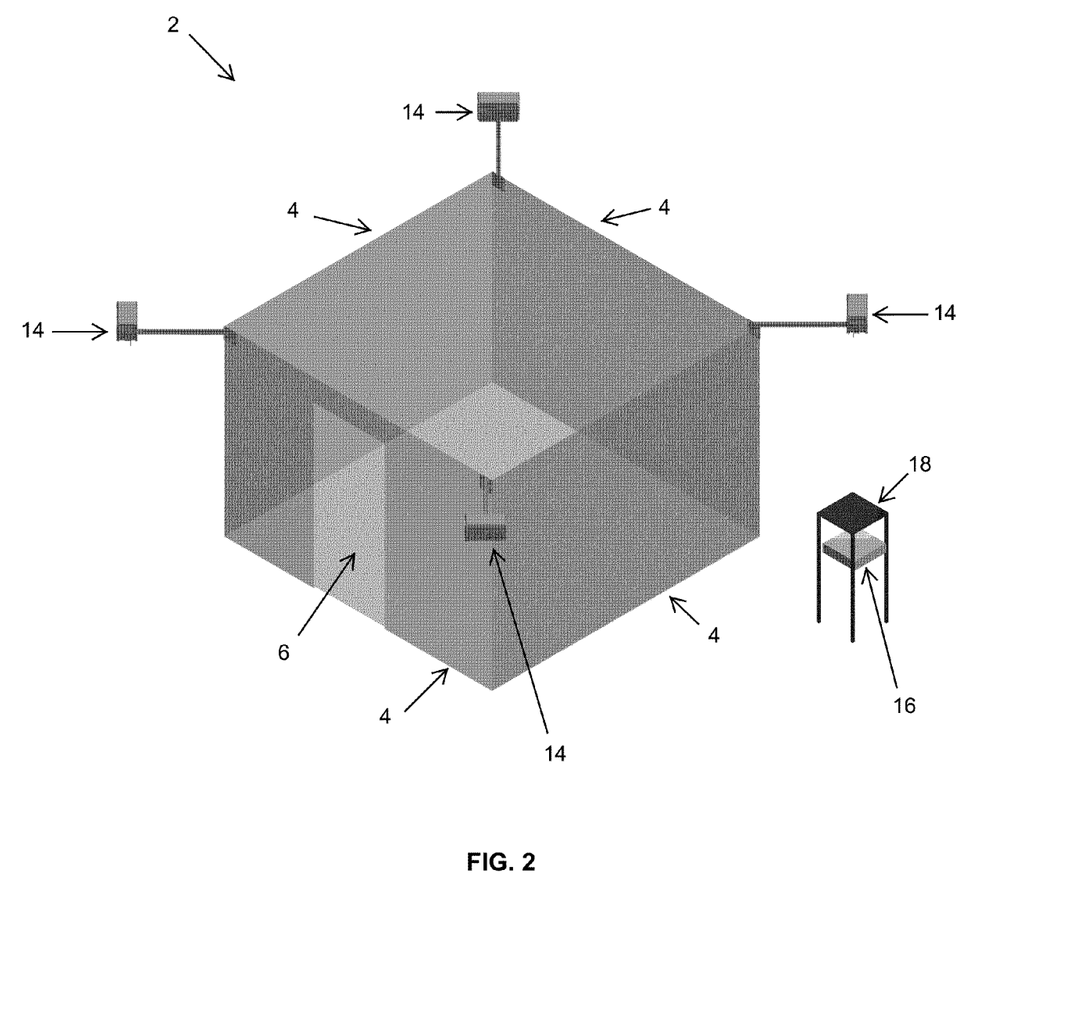
FIG. 2 is a perspective view of an exterior of an example enclosure of the present invention used with the system of the present invention.

With reference to FIG. 2, shown is a perspective view of an exterior of an example enclosure used with the system of the present invention. The enclosure is a typical enclosure, and a suitable enclosure need not have all the features shown in FIG. 1. Further, the enclosure may be constructed of metal and may be constructed of any suitable material. The enclosure may be of any size, from a box that may enclose a single electronic device, to a building that may enclose from a single electronic device to numerous electronic devices. The enclosure 2 comprises four walls 4, the door 6, exterior antennae assemblies 14, an RX unit 16, and an exterior server rack 18. The exterior server rack 18 is located onsite with the enclosure 2, and may or may not house other unrelated equipment.

In the system of the present invention, software is used to control any adjustable hardware of the system, including, but not limited to, switches, attenuator, network analyzer, TX/RX module communication, user interface, and door sensors. Every evaluation or decision point in the steps of the system of the present invention are made via software as well. For example, anytime a switch path is changed, an attenuation is changed, a sweep is commanded, an evaluation is made, and a decision is made, these are done with the software, in conjunction with the hardware, used in the system of the present invention.

Figure 3:
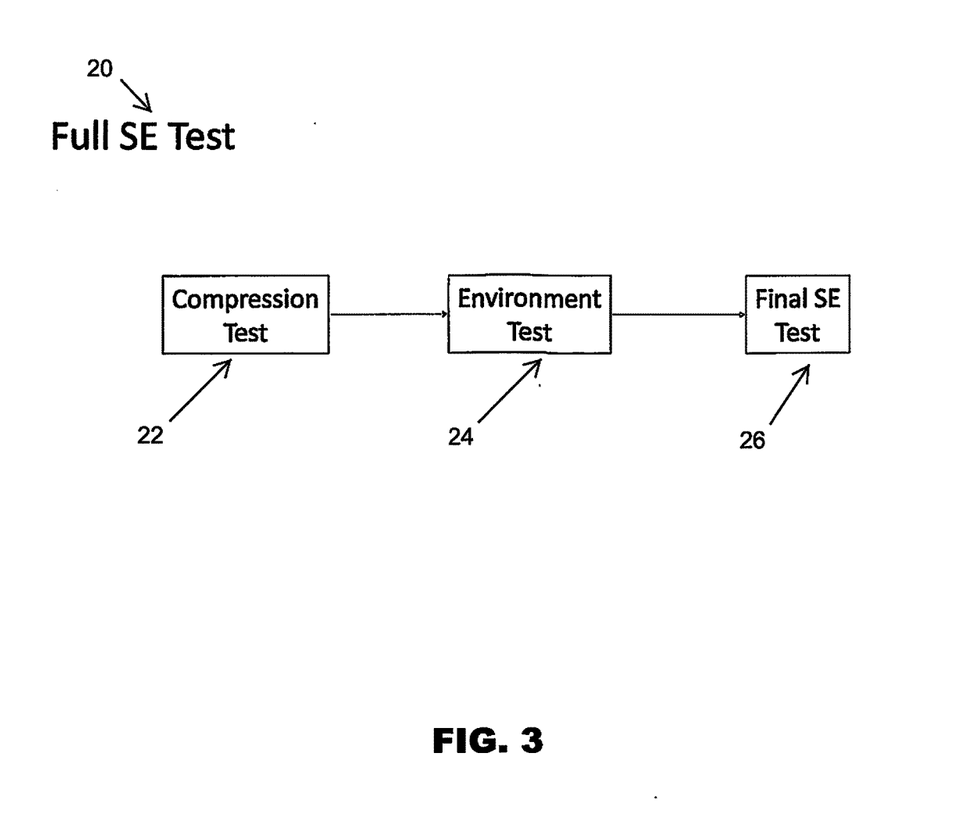
FIG. 3 is a flow diagram of a full shielding effectiveness ("SE") test of the system of the present invention.

With reference to FIG. 3, shown is a flow diagram of a full SE test 20 of the system of the present invention. A full SE test 20 comprises three sub-tests. A first sub-test is a compression test 22. A second sub-test is an environment test 24. A third sub-test is a final SE test 26.

Figure 4:
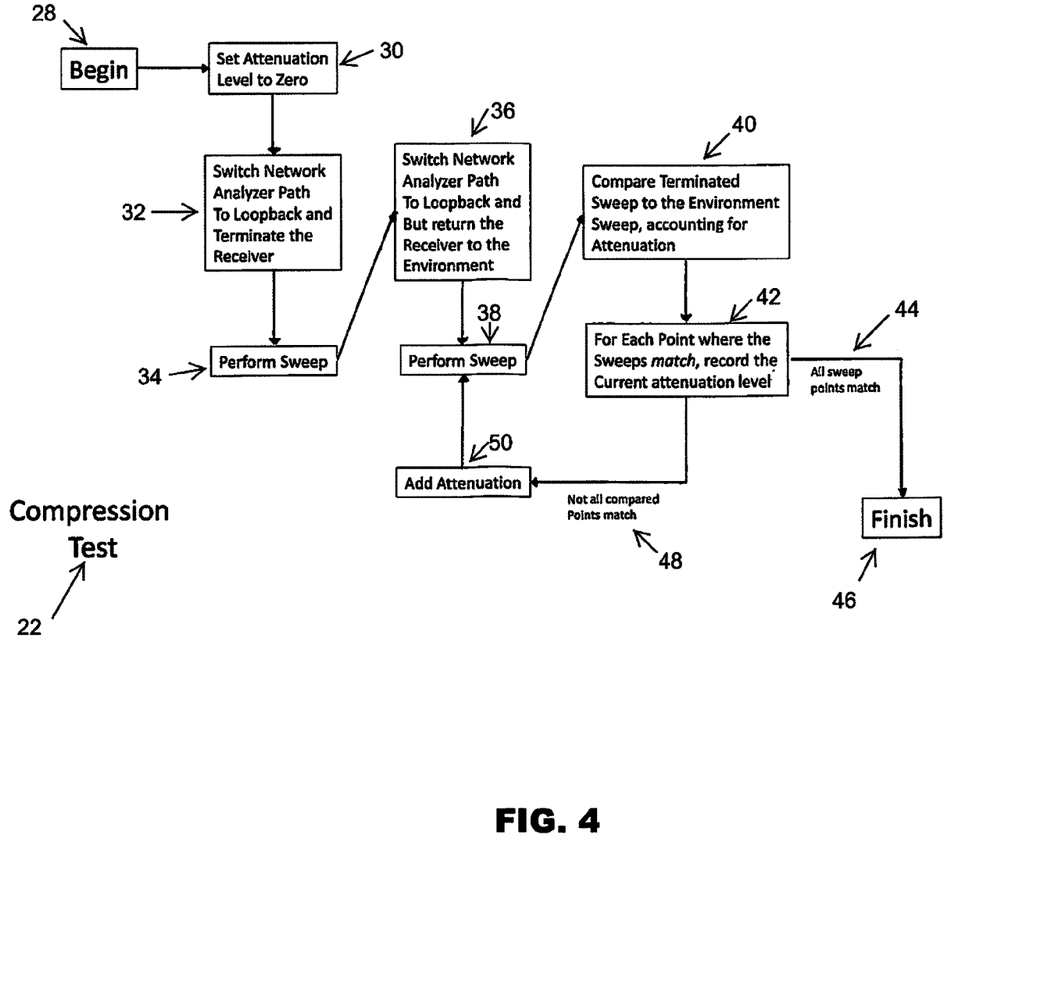
FIG. 4 is a flow diagram of a compression test of the system of the present invention.

With reference to FIG. 4, shown is a flow diagram of a compression test 22 of the system of the present invention. The compression test 22 comprises a first step of beginning the test 28 and setting an attenuation level to zero 30 (wherein variable attenuation is software-controlled hardware). A second step 32 comprises setting a network analyzer switch path to loopback and terminate a receiver (wherein all the switch paths in the system of the present invention are RF switches, and the RF switches are software-controlled hardware). A third step 34 comprises performing a sweep of the enclosure (wherein all sweeps in the system of the present invention are controlled via software). A fourth step 36 comprises switching a network analyzer path to loopback, but returning a receiver to the environment. A fifth step 38 comprises performing another sweep. A sixth step 40 comprises comparing (which comparing is performed by means of the software of the system of the present invention) a terminated sweep to the environment sweep and accounting for attenuation (which accounting calculation is performed by means of the software of the system of the present invention). A seventh step 42 comprises recording a current attenuation level for each data point where the sweeps match (which recording is performed by means of the software of the system of the present invention). After the seventh step, if a decision point 44 is reached (which decision points are evaluated and acted upon by means of the software of the system of the present invention), and it is determined that all of the sweep data points match, then the compression test 22 is finished 46. After the seventh step, if a decision point 48 is reached, and it is determined that not all of the sweep data points match, then an eighth step 50, and a repeating step as necessary, ensues and comprises adding attenuation to the system, and repeating the fifth step 38 through the seventh step 42 as necessary until the compression test cycle is finished 46.

Figure 5:
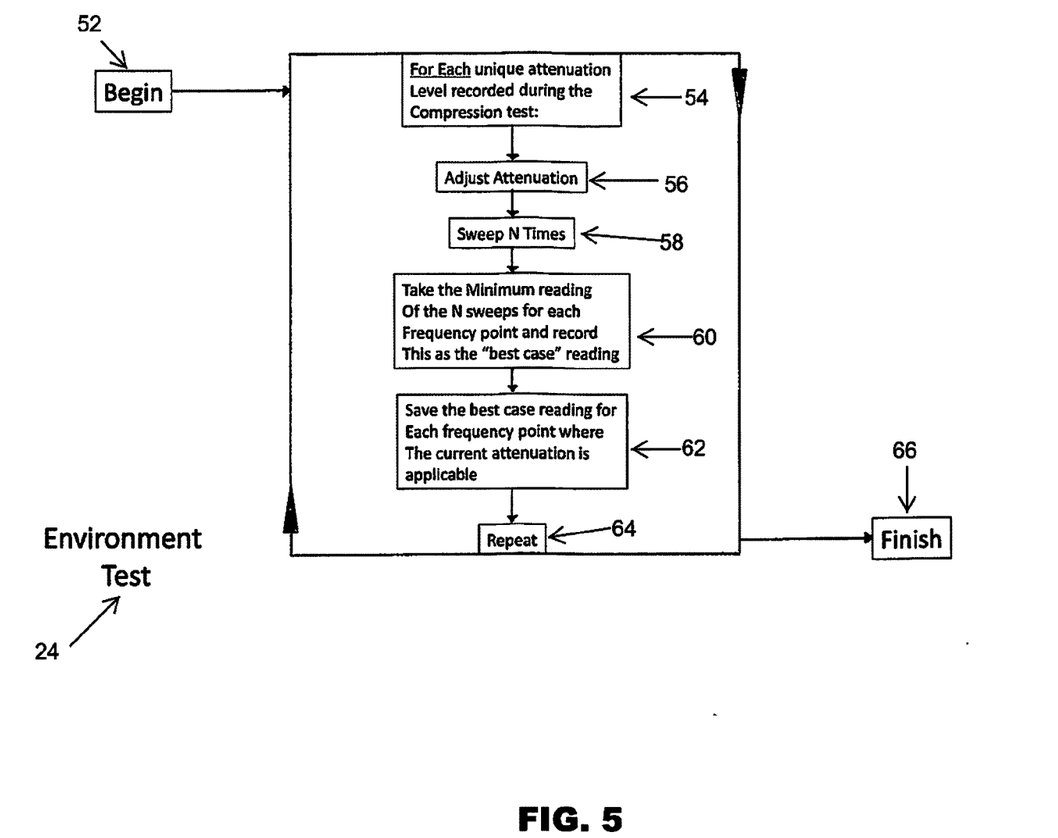
FIG. 5 is a flow diagram of an environment test of the system of the present invention.

With reference to FIG. 5, shown is a flow diagram of an environment test 24 of the system of the present invention. The environment test 24 comprises a first step of beginning the test 24 and recording during the compression test 22 each unique attenuation level 54. A second step 56 comprises adjusting attenuation for each unique level recorded in the first step 54. A third step 58 comprises sweeping the system N times; wherein 'N' is an arbitrary number. The larger the number of sweeps, the more effective the test performance; however, the longer the system will take to conclude the test. The optimal N-value is a tradeoff between speed and accuracy, and is determined as desired by a user. A fourth step 60 comprises reading a minimum of the N sweeps for each frequency point and recording the minimum as a 'best case' reading. A fifth step 62 comprises saving the 'best case' reading for each frequency point of the fourth step 60 in which a current attenuation is applicable. A sixth step 64, and a repeating step as necessary, comprises repeating the environment test 24, achieving a satisfactory attenuation [an attenuation level at which the receiver is no longer being compressed by powerful environmental or electromagnetic ("EM") signals], and finishing 66 the test 24. Compression at any point is determined by whether or not a receiver path sweep in compression check matches an initial terminated compression sweep in the compression test.

Figure 6:
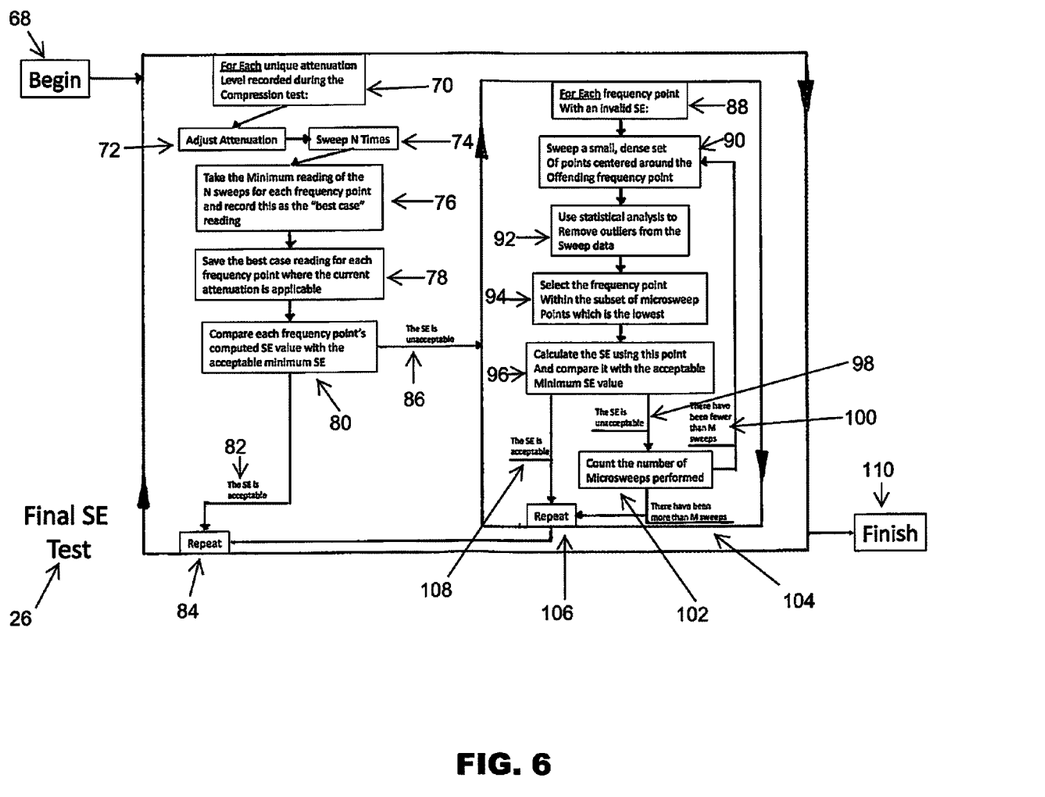
FIG. 6 is a flow diagram of a final SE test of the system of the present invention.

With reference to FIG. 6, shown is a flow diagram of a final SE test 26 of the system of the present invention. The final SE test 26 begins 68 with a first step 70 which comprises recording during the compression test 22 each unique attenuation level. A second step 72 comprises adjusting attenuation for each unique level recorded in the first step 70. A third step 76 comprises sweeping the system N times; wherein 'N' is an arbitrary number. The larger the number of sweeps, the more effective the test performance; however, the longer the system will take to conclude the test. The number of sweeps is determined as desired by a user. The optimal N-value is a tradeoff between speed and accuracy, and is determined as desired by a user. A fourth step 78 comprises reading a minimum of the N sweeps for each frequency point and recording the minimum as a 'best case' reading. A fifth step 80 comprises comparing each frequency point's computed SE value with the acceptable minimum SE. After the fifth step 80, if a decision point 82 is reached, and it is determined that the SE is acceptable, then the final SE test 26 is repeated from the first step 70 as necessary until the final SE test 26 is finished 110.

With continued reference to FIG. 6, after the fifth step 80, if a decision point 86 is reached, and it is determined that the SE is unacceptable, then a sixth step 90 comprises, for each frequency point with an invalid SE 88, sweeping a small, dense set of points centered around an offending frequency point. A seventh step 92 comprises using statistical analysis and removing outliers from the sweep data. An eighth step 94 comprises selecting the frequency point within the subset of micro-sweep frequency points which is the lowest. A ninth step 96 comprises calculating the SE using the lowest point from the eighth step 94 and comparing the point with the acceptable minimum SE value. After the ninth step 96, if a decision point 108 is reached, and it is determined that the SE value is acceptable, then the final SE test 26 is repeated from the first step 70 as necessary until the final SE test 26 is finished 110.

After the ninth step 96, if a decision point 98 is reached, and it is determined that the SE value is unacceptable, then a tenth step 102 comprises counting the number of micro-sweeps performed. After the tenth step 102, if a decision point 104 is reached, and it is determined that there have been more than 'M' sweeps; wherein 'M' is an arbitrary number, then the system cycles back to the sixth step 90, and repeats the test cycle as necessary. M is an arbitrary number independent of N, but functionally behaves the same way. The higher the M-value, the more accurate the measurement, but the longer the test will take. The number of 'M' sweeps is determined as desired by a user. After satisfactorily completing all test cycles of the final SE test 26, the test 26 is finished 110.

Unless defined otherwise, all technical and scientific terms used herein have the same meaning as commonly understood by one of ordinary skill in the art to which this invention belongs. Although the present invention has been described with reference to the preferred methods, materials, and specific embodiments, it is understood that any methods and materials similar or equivalent to those described herein can also be used in the practice, or testing, of the present invention, and that modifications and variations of the present invention are possible, without departing from the scope of the invention, which invention is defined by the claims.

The invention claimed is:
1. A remotely controlled, automated shielding effectiveness test system comprising:
   providing a high-altitude electromagnetic pulse enclosure enclosing at least an electronic device;

providing an electronic testing apparatus for testing effectiveness of high-altitude electromagnetic pulse shielding of the enclosure; and
performing a shielding effectiveness test by the apparatus on the enclosure;
wherein the shielding effectiveness test comprises performing a first compression sub-test by the apparatus on the enclosure, then performing a second environment sub-test by the apparatus on the enclosure, and then performing a third final shielding effectiveness sub-test by the apparatus on the enclosure;
further wherein the compression sub-test comprises:
setting an attenuation level to zero;
setting a network analyzer switch path to loopback and to terminate a receiver;
performing a sweep of the enclosure;
switching a network analyzer path to loopback, but returning a receiver to an environment;
performing another sweep;
comparing a terminated sweep to an environment sweep and accounting for attenuation;
recording a current attenuation level for each data point wherein the sweeps match;
reaching a decision point; and
determining that all the sweep data points match.

2. A remotely controlled, automated shielding effectiveness test system comprising:
providing a high-altitude electromagnetic pulse enclosure enclosing at least an electronic device;
providing an electronic testing apparatus for testing effectiveness of high-altitude electromagnetic pulse shielding of the enclosure; and
performing a shielding effectiveness test by the apparatus on the enclosure;
wherein the shielding effectiveness test comprises performing a first compression sub-test by the apparatus on the enclosure, then performing a second environment sub-test by the apparatus on the enclosure, and then performing a third final shielding effectiveness sub-test by the apparatus on the enclosure;
further wherein the compression sub-test comprises:
setting an attenuation level to zero;
setting a network analyzer switch path to loopback and to terminate a receiver;
performing a sweep of the enclosure;
switching a network analyzer path to loopback, but returning a receiver to an environment;
performing another sweep;
comparing a terminated sweep to an environment sweep and accounting for attenuation;
recording a current attenuation level for each data point wherein the sweeps match;
reaching a decision point; and
determining that all the sweep data points match;
further wherein the compression sub-test further comprises:
determining that not all the sweep data points match;
adding attenuation to the system;
performing another sweep;
comparing a terminated sweep to an environment sweep and accounting for attenuation;
recording a current attenuation level for each data point wherein the sweeps match;
reaching a decision point; and
determining that all the sweep data points match.

3. A remotely controlled, automated shielding effectiveness test system comprising:
providing a high-altitude electromagnetic pulse enclosure enclosing at least an electronic device;
providing an electronic testing apparatus for testing effectiveness of high-altitude electromagnetic pulse shielding of the enclosure; and
performing a shielding effectiveness test by the apparatus on the enclosure;
wherein the shielding effectiveness test comprises performing a first compression sub-test by the apparatus on the enclosure, then performing a second environment sub-test by the apparatus on the enclosure, and then performing a third final shielding effectiveness sub-test by the apparatus on the enclosure;
further wherein the environment sub-test comprises:
recording during the compression test each unique attenuation level;
adjusting attenuation for each unique level recorded in the recording step;
sweeping the system N times; wherein N is determined by a user;
reading a minimum of the N sweeps for each frequency point and recording the minimum as a 'best case' reading;
saving the 'best case' reading for each frequency point of the reading step in which a current attenuation is applicable;
repeating the environment test as necessary until; and
achieving a satisfactory attenuation.

4. A remotely controlled, automated shielding effectiveness test system comprising:
providing a high-altitude electromagnetic pulse enclosure enclosing at least an electronic device;
providing an electronic testing apparatus for testing effectiveness of high-altitude electromagnetic pulse shielding of the enclosure; and
performing a shielding effectiveness test by the apparatus on the enclosure;
wherein the shielding effectiveness test comprises performing a first compression sub-test by the apparatus on the enclosure, then performing a second environment sub-test by the apparatus on the enclosure, and then performing a third final shielding effectiveness sub-test by the apparatus on the enclosure;
further wherein the final shielding effectiveness sub-test comprises:
recording during the compression sub-test each unique attenuation level;
adjusting attenuation for each unique level recorded;
sweeping the system N times; wherein N is determined by a user;
reading a minimum of the N sweeps for each frequency point;
recording the minimum of the N sweeps as a 'best case' reading;
comparing a computed shielding effectiveness value of each frequency point with an acceptable minimum shielding effectiveness value;
reaching a decision point; and
determining the shielding effectiveness value is acceptable.

5. A remotely controlled, automated shielding effectiveness test system comprising:
providing a high-altitude electromagnetic pulse enclosure enclosing at least an electronic device;
providing an electronic testing apparatus for testing effectiveness of high-altitude electromagnetic pulse shielding of the enclosure; and performing a shielding effectiveness test by the apparatus on the enclosure;
wherein the shielding effectiveness test comprises performing a first compression sub-test by the apparatus on the enclosure, then performing a second environment sub-test by the apparatus on the enclosure, and then performing a third final shielding effectiveness sub-test by the apparatus on the enclosure;
further wherein the final shielding effectiveness sub-test comprises:
  recording during the compression sub-test each unique attenuation level;
  adjusting attenuation for each unique level recorded;
  sweeping the system N times; wherein N is determined by a user;
  reading a minimum of the N sweeps for each frequency point;
  recording the minimum of the N sweeps as a 'best case' reading;
  comparing a computed shielding effectiveness value of each frequency point with an acceptable minimum shielding effectiveness value;
  reaching a decision point; and
  determining the shielding effectiveness value is acceptable;
further wherein the final shielding effectiveness sub-test further comprises:
  determining the shielding effectiveness value is unacceptable;
  sweeping a small, dense set of points centered around an offending frequency point for each frequency point with an invalid shielding effectiveness value;
  using statistical analysis and removing outliers from a sweep data set of frequency points;
  selecting a lowest frequency point within a subset of micro-sweep frequency points;
  calculating the shielding effectiveness value using the lowest frequency point from the selecting step and comparing the lowest frequency point with an acceptable minimum shielding effectiveness value;
  reaching a decision point; and
  determining the shielding effectiveness value is acceptable.

6. A remotely controlled, automated shielding effectiveness test system comprising:
providing a high-altitude electromagnetic pulse enclosure enclosing at least an electronic device;
providing an electronic testing apparatus for testing effectiveness of high-altitude electromagnetic pulse shielding of the enclosure; and
performing a shielding effectiveness test by the apparatus on the enclosure;
wherein the shielding effectiveness test comprises performing a first compression sub-test by the apparatus on the enclosure, then performing a second environment sub-test by the apparatus on the enclosure, and then performing a third final shielding effectiveness sub-test by the apparatus on the enclosure;
further wherein the final shielding effectiveness sub-test comprises:
  recording during the compression sub-test each unique attenuation level;
  adjusting attenuation for each unique level recorded;
  sweeping the system N times; wherein N is determined by a user;
  reading a minimum of the N sweeps for each frequency point;
  recording the minimum of the N sweeps as a 'best case' reading;
  comparing a computed shielding effectiveness value of each frequency point with an acceptable minimum shielding effectiveness value;
  reaching a decision point; and
  determining the shielding effectiveness value is acceptable;
further wherein the final shielding effectiveness sub-test further comprises:
  determining the shielding effectiveness value is unacceptable;
  sweeping a small, dense set of points centered around an offending frequency point for each frequency point with an invalid shielding effectiveness value;
  using statistical analysis and removing outliers from a sweep data set of frequency points;
  selecting a lowest frequency point within a subset of micro-sweep frequency points;
  calculating the shielding effectiveness value using the lowest frequency point from the selecting step and comparing the lowest frequency point with an acceptable minimum shielding effectiveness value;
  reaching a decision point; and
  determining the shielding effectiveness value is acceptable;
further wherein the final shielding effectiveness sub-test further comprises:
  determining the shielding effectiveness value is unacceptable;
  counting a number of micro-sweeps performed;
  reaching a decision point;
  determining if there have been more than M sweeps; wherein M is determined by a user; and
  determining the shielding effectiveness value is acceptable.

7. A remotely controlled, automated shielding effectiveness test system comprising:
providing a high-altitude electromagnetic pulse enclosure enclosing at least an electronic device;
providing an electronic testing apparatus for testing effectiveness of high-altitude electromagnetic pulse shielding of the enclosure; and
performing a shielding effectiveness test by the apparatus on the enclosure;
wherein the shielding effectiveness test comprises performing a first compression sub-test by the apparatus on the enclosure comprising setting an attenuation level to zero; setting a network analyzer switch path to loopback and to terminate a receiver; performing a sweep of the enclosure; switching a network analyzer path to loopback, but returning a receiver to an environment; performing another sweep; comparing a terminated sweep to an environment sweep and accounting for attenuation; recording a current attenuation level for each data point wherein the sweeps match; reaching a decision point; and determining that all the sweep data points match;
wherein the shielding effectiveness test further comprises performing a second environment sub-test by the apparatus on the enclosure comprising recording during the compression test each unique attenuation level; adjusting attenuation for each unique level recorded in the recording step; sweeping the system N times; wherein N is determined by a user; reading a minimum of the N sweeps for each frequency point and recording the minimum as a 'best case' reading; saving the 'best case' reading for each frequency point of the reading step in which a current attenuation is applicable; repeating the environment test as necessary until; and achieving a satisfactory attenuation; and wherein the shielding effectiveness test further comprises performing a third final shielding effectiveness sub-test by the apparatus on the enclosure comprising recording during the compression sub-test each unique attenuation level; adjusting attenuation for each unique level recorded; sweeping the system N times; wherein N is determined by a user; reading a minimum of the N sweeps for each frequency point; recording the minimum of the N sweeps as a 'best case' reading; comparing a computed shielding effectiveness value of each frequency point with an acceptable minimum shielding effectiveness value; reaching a decision point; and determining the shielding effectiveness value is acceptable.

8. The system of claim 7; wherein the compression sub-test further comprises:

determining that not all the sweep data points match;

adding attenuation to the system;

performing another sweep;

comparing a terminated sweep to an environment sweep and accounting for attenuation;

recording a current attenuation level for each data point wherein the sweeps match;

reaching a decision point; and determining that all the sweep data points match.

9. The system of claim 7; wherein the final shielding effectiveness sub-test further comprises:

determining the shielding effectiveness value is unacceptable;

sweeping a small, dense set of points centered around an offending frequency point for each frequency point with an invalid shielding effectiveness value;

using statistical analysis and removing outliers from a sweep data set of frequency points;

selecting a lowest frequency point within a subset of micro-sweep frequency points;

calculating the shielding effectiveness value using the lowest frequency point from the selecting step and comparing the lowest frequency point with an acceptable minimum shielding effectiveness value;

reaching a decision point; and determining the shielding effectiveness value is acceptable.

10. The system of claim 9; wherein the final shielding effectiveness sub-test further comprises:

determining the shielding effectiveness value is unacceptable;

counting a number of micro-sweeps performed;

reaching a decision point;

determining if there have been more than M sweeps; wherein M is determined by a user; and determining the shielding effectiveness value is acceptable.

* * * * *